(12) United States Patent
Kakizawa et al.

(10) Patent No.: US 6,514,921 B1
(45) Date of Patent: Feb. 4, 2003

(54) CLEANING AGENT

(75) Inventors: Masahiko Kakizawa, Saitama (JP); Osamu Ichikawa, Saitama (JP); Ichiro Hayashida, Saitama (JP)

(73) Assignee: Wako Pure Chemical Industries, Ltd., Osaka (JP)

( * ) Notice: Subject to any disclaimer, the term of this patent is extended or adjusted under 35 U.S.C. 154(b) by 0 days.

(21) Appl. No.: 09/658,926

(22) Filed: Sep. 11, 2000

Related U.S. Application Data

(62) Division of application No. 08/868,891, filed on Jun. 4, 1997, now Pat. No. 6,143,705.

(30) Foreign Application Priority Data

Jun. 5, 1996 (JP) ............................................... 8-165353

(51) Int. Cl.$^7$ .............................. C11D 1/66; C11D 3/20
(52) U.S. Cl. ........................ 510/175; 510/177; 510/238; 510/239; 134/1.3; 134/2; 134/3; 134/41; 438/745
(58) Field of Search .............................. 134/3, 41, 1.3, 134/2; 510/238, 239, 175, 177; 252/180, 175, 181, 389.22; 210/699, 697; 438/172, 745

(56) References Cited

U.S. PATENT DOCUMENTS

| | | | |
|---|---|---|---|
| 2,970,044 A | 1/1961 | Ostapkovich et al. ........... 41/42 |
| 3,290,174 A | 12/1966 | Kendall .......................... 134/3 |
| 3,438,811 A | 4/1969 | Harriman et al. ............... 134/2 |
| 4,164,477 A * | 8/1979 | Whitley | |
| 4,181,623 A | 1/1980 | Dillarstone ................. 252/143 |
| 4,209,418 A * | 6/1980 | Anderson | |
| 4,217,234 A * | 8/1980 | Krisp et al. | |
| 4,239,567 A | 12/1980 | Winings | |
| 4,264,418 A | 4/1981 | Wood et al. ........... 204/129.95 |
| 4,395,304 A | 7/1983 | Kern et al. .................. 156/657 |
| 4,452,643 A | 6/1984 | Martin et al. .................... 134/3 |
| 4,529,450 A | 7/1985 | Panayappan .................... 134/4 |
| 4,587,043 A * | 5/1986 | Murray et al. | |
| 4,610,728 A | 9/1986 | Natesh et al. .................. 134/2 |
| 4,623,399 A | 11/1986 | Frenier .......................... 134/3 |
| 4,626,324 A | 12/1986 | Samuels et al. ........... 204/43.1 |
| 4,802,990 A * | 2/1989 | Inskeep et al. | |
| 4,845,125 A * | 7/1989 | Geier | |
| 4,851,148 A | 7/1989 | Yamasoe et al. ............. 252/142 |
| 4,992,212 A * | 2/1991 | Corring et al. | |
| 5,039,441 A * | 8/1991 | Thomas et al. | |
| 5,288,332 A | 2/1994 | Pustilinik et al. .............. 134/27 |
| 5,290,361 A | 3/1994 | Hayashida et al. ............. 134/2 |
| 5,318,717 A * | 6/1994 | Schafer | |
| 5,389,194 A | 2/1995 | Rostoker et al. | |
| 5,460,802 A | 10/1995 | Asami et al. ................... 424/49 |
| 5,466,389 A | 11/1995 | Ilardi et al. .................. 252/156 |
| 5,472,629 A | 12/1995 | Lysy et al. ................... 252/142 |
| 5,635,104 A | 6/1997 | Kott et al. ................. 252/186.1 |
| 5,635,167 A * | 6/1997 | Said et al. | |

FOREIGN PATENT DOCUMENTS

| | | |
|---|---|---|
| EP | 560324 A1 | 9/1993 |
| EP | 690482 A2 | 1/1996 |
| EP | 690483 A2 | 1/1996 |
| EP | 784336 A2 | 7/1997 |
| EP | 789071 A1 | 8/1997 |
| FR | 1603558 | 12/1968 |
| JP | 01048302 A * | 9/1990 |
| JP | 03161585 A * | 7/1991 |
| JP | 03260190 A * | 11/1991 |
| JP | H7286172 | 10/1995 |
| JP | 2504978 | 4/1996 |
| SU | 1070210 | 1/1984 |
| SU | 1153226 A * | 4/1985 |
| WO | WO96/26538 | 8/1996 |

OTHER PUBLICATIONS

Kern et al, "Cleaning Solutions Based on Peroxide for use in Silicon Semiconductor Technology", RCA Review, Jun. 1970, by Werner Kern.
Abstract of JP 3–219000, 1991.
Abstract of JP 6–274700, 1994.

* cited by examiner

*Primary Examiner*—Gregory E. Webb
(74) *Attorney, Agent, or Firm*—Armstrong, Westerman & Hattori, LLP

(57) ABSTRACT

Removing particles and metallic contaminants without corrosing the metallized wirings and without giving adverse effect of planarization on the semiconductor substrate surface can be effectively achieved by use of a cleaning agent which comprises an organic acid having at least one carboxyl group and a complexing agent having chelating ability.

17 Claims, No Drawings

CLEANING AGENT

This application is a divisional application of Ser. No. 08/868,891 filed Jun. 4, 1997 now U.S. Pat. No. 6,143,705.

BACKGROUND OF THE INVENTION

The present invention relates to a cleaning agent for the semiconductor substrate surface used in production steps of semiconductors and LCDs (liquid crystal displays), and further relates to a method for cleaning the semiconductor substrate surface by using said cleaning agent.

At present, according to the recent trend of high integration of LSI, various technologies have been introduced in production steps of semiconductors. Silicon wafers, which are used for producing semiconductor devices mainly applied to production of LSIs, are prepared by cutting out from a single crystal of silicon ingot and being subjected to production steps of lapping and polishing. For these reasons, the surface of thus prepared silicon wafers are contaminated with a large amount of metallic impurities. Furthermore, in steps following to these production steps, the silicon wafer's surface may have a number of risks of metallic contamination, because the wafers are subjected to production steps of semiconductor devices such as ion implantation step, metal terminal formation step and etc.

In the recent years, it has been proposed to introduce chemical mechanical polishing (CMP) technologies for producing the semiconductor devices in accordance with the requirement of planarization the semiconductor substrate surface due to the recent trend of multi-level metallized wirings. The CMP technology is a method to make the surface of silicon wafers flat by using a slurry of silica or alumina. The objectives of polishing are silicon oxide film, wirings and plugs on the surface. In this case, the surface of silicon wafers is contaminated with silica or alumina slurry, metallic impurities contained in the slurries, and metallic impurities caused by polished plug or wiring metals. In such a case, a large amount of metallic contaminants are widely spread out on the whole surface of the silicon wafers.

When the semiconductor substrate surface is contaminated with metallic impurities as mentioned above, the electrical properties of semiconductor devices are affected for the worse, and as a result the reliability of semiconductor devices will be lowered. Further, the semiconductor device may possibly be destroyed for a large amount of metallic contamination. As such it is necessary to remove the metallic contaminants from the substrate surface by introducing a cleaning step after the CMP process.

Nowadays, the cleaning step is conducted by a method of chemical cleaning, physical cleaning or combinations thereof. Among methods of chemical cleaning, RCA cleaning method which was developed the 1970's, is used widely in the art. The solution of RCA cleaning is consisting of acid-type cleaning solutions and alkali-type cleaning solutions. The acid-type cleaning solution, such as HPM (hydrochloric acid-hydrogen peroxide mixed aqueous solution) and DHF (diluted hydrofluoric acid solution) is used for removing the metallic contaminants. On the other hand, the alkali type cleaning solution, which is represented by APM (ammonia-hydrogen peroxide mixed aqueous solution), possesses an excellent ability to remove the particle contaminants, but it possesses insufficient ability to remove the metallic contaminants.

Under such circumstances, for the purpose to remove the metallic contaminants, the acid-type cleaning solution such as HPM and DHF may inevitably be used.

However, the metallized wirings being provided on the semiconductor substrate surface may be corroded with the cleaning solution, because such an acid-type cleaning solution possesses strong ability to dissolve the metals.

In order to avoid such corrosion problem of the metallized wirings being provided on the semiconductor substrate surface, a physical (mechanical) cleaning method can be applied. As to the physical cleaning method, there can be exemplified by a brush-scrubbing method by using high speed rotating brush(s); an ice-scrubbing method by using jetted out fine particles of ice; a method of cleaning by high pressure jet stream of ultra-pure water; and a megasonic cleaning method by using ultrasonic wave and the like.

Each one of these physical cleaning methods is effective to avoid corrosion problem of the metallized wirings being provided on the semiconductor substrate surface. However, the ability for removing metallic contaminants can hardly be expected only by use of these physical cleaning methods. For this reason, it is proposed to use the physical cleaning method in combination with chemical cleaning method by using an acid-type cleaning solution.

It should be noted that though the ability for removing metallic contaminants can be expected by conducting the RCA cleaning method using an inorganic acid, such method has some problems exemplified that the metallized wirings being provided on the surface may be damaged, further the insulation film of silicon oxide being provided on the surface may be etched with the inorganic acid.

Therefore, it is necessary to dilute the concentration of the inorganic acid as low as possible, and to reduce the cleaning time as short as possible.

However, as a result of such considerations, adequate effects for cleaning can not be expected.

In addition to the above, another method for cleaning the semiconductor substrate surface is available, in which an aqueous solution of a monocarboxylic acid in combination with a surfactant is used. However, this method is understood that though it is effective to improve the wettability between the aqueous solution and the semiconductor substrate surface by use of the surfactant, this method requires the longer time to remove the metallic contaminants, further an adequate cleaning efficiency can not be expected.

Additionally, another method for removing the metallic contaminants such as the one using citric acid solution in combination with a brush-scrubbing cleaning was reported. However, the effect for removing the metallic contaminants was insufficient only by use of citric acid solution, so that an adequate cleaning effect was not obtained.

As explained above, there have not been found yet any effective means for removing particles and metallic contaminants without corroding the metallized wirings and without giving adverse effect of planarization on the semiconductor substrate surface.

Problems to be Solved by the Invention

In consideration of these facts as mentioned above, the invention provides a cleaning agent for the semiconductor substrate surface without corroding the metallized wirings and without increasing micro-roughness on the semiconductor substrate surface, as well as to provide a cleaning method for the semiconductor substrate surface by use of said cleaning agent.

Means for Solving the Problems

The present invention is established to solve the above-mentioned problems and the present invention relates to a cleaning agent for the semiconductor substrate surface which comprises an organic acid having at least one carboxyl group and a complexing agent having chelating ability.

The present invention further relates to a cleaning method for the semiconductor substrate surface, which comprises treating the semiconductor substrate surface with a cleaning agent comprising an organic acid having at least one carboxyl group and a complexing agent having chelating ability.

The present inventors have made an extensive research work for achieving the above-mentioned object.

As a result, the inventors have found that the metallic contaminants being adsorbed and adhered on the semiconductor substrate surface can easily be removed by use of a cleaning agent containing an organic acid having at least one carboxyl group and a complexing agent having chelating ability, without corroding metallized wirings provided on the semiconductor substrate surface and without depreciating the planarization on the surface thereof which are occurred when a strong acid or strong alkali solution is used, and on the basis of these findings, the present invention has been established.

The reason why the above-mentioned object can be achieved by conducting a method of the present invention is presumed as follows. That is, when the organic acid dissolves metal oxides and metal hydroxides, such as Fe and Al, even though they are in quite small amounts, said dissolved metallic ions may form metal complexes with the complexing agent. As the result, an equilibrium in the reaction system of the cleaning agent may be transferred to the direction toward to dissolve the metals, which improves the metal dissolving power of the organic acid, thus removal of the metallic contaminants being adsorbed and adhered on the semiconductor substrate surface can be achieved.

The organic acid to be used in the present invention is one having at least one carboxyl group, preferably one having 1 to 3 carboxyl groups and more preferably one having 2 to 3 carboxyl groups, and the organic acid may contain also 1 to 3 hydroxyl groups and/or 1 to 3 amino groups.

The examples of said organic acids of the present invention include monocarboxylic acids such as formic acid, acetic acid and propionic acid, dicarboxylic acids such as oxalic acid, malonic acid, succinic acid, glutaric acid, adipic acid, pimelic acid, maleic acid, fumaric acid and phthalic acid, tricarboxylic acids such as trimellitic acid and tricarballylic acid, oxycarboxylic acids exemplified by oxymonocarboxylic acids such as hydroxybutyric acid, lactic acid and salicylic acid, oxydicarboxylic acids such as malic acid and tartaric acid and oxytricarboxylic acids such as citric acid; aminocarboxylic acids such as aspartic acid and glutamic acid.

Among them, a dicarboxylic acid or an oxycarboxylic acid is preferable.

The organic acid relating to the present invention can be used singly or in combination suitably with 2 or more of them.

The complexing agents having chelating ability of the present invention are preferably those which can be able to form complex compounds with the metallic contaminants such as Fe and Al, and they are exemplified by aminopolycarboxylic acids such as ethylenediamine tetraacetic acid (EDTA), and trans-1,2-diaminocyclohexane tetraacetic acid (CyDTA), phosphonic acid derivatives such as ethylenediamine tetra(methylenephosphonic acid) (EDTPO), ethylenediamine di(methylenephosphonic acid) (EDDPO), nitrilotris (methylenephosphonic acid) (NTPO) and 1-hydroxyethylydene-1,1'-diphosphonic acid (HEDPO), condensed phosphoric acids such as tripolyphosphoric acid and hexamethaphosphoric acid, diketones such as acetylacetone and hexafluoroacetylacetone, amines such as ethylenediamine and triethanolamine, an inorganic ion such as a halide ion (for example $F^-$, $Cl^-$, $Br^-$, $I^-$), a cyanide ion, a thiocyanate ion, a thiosulfate ion and an ammonium ion. Among them, a phosphonic acid derivative is preferable.

The complexing agents relating to the present invention may be used singly or used suitably combined with 2 or more of them.

The cleaning agent of the present invention is generally used in a solution, preferably in an aqueous solution. The organic acid and the complexing agent contained therein are dissolved in water to give the aqueous solution containing the organic acid and the complexing agent.

When the concentration of the organic acid and the complexing agent in the aqueous solution is too low, an adequate cleaning effect can not be obtained and additionally, in case of the semiconductor substrate surface being unexpectedly contaminated severely, the cleaning effect may be decreased. On the other hand when the concentration of the organic acid in the solution is too high, adequate cleaning effect can be obtained, but is not preferable from the cost-performance standpoint.

On the other hand, when the complexing agent is used in the higher concentration, an adequate cleaning effect can be obtained. However, the use of a large amount of complexing agent may bring harmful contamination with organic impurities on the semiconductor substrate surface, which results in certain problems of electrical properties of the semiconductor. From the economical standpoint, it is preferable that the complexing agent may not be used in a large quantity.

Generally, the concentration of the organic acid in the solution is selected from a the range of 0.05 to 50% by weight, preferably 1 to 30% by weight.

Generally the complexing agent is used in an amount within the range of 0.01 to 10% by weight, preferably 0.1 to 1.0% by weight in the solution.

In order to clean the semiconductor substrate surface, the surface is treated with the cleaning agent of the present invention mentioned above. For this purpose, generally, silicon wafers are dipped in the cleaning agent. In addition, this purpose can also be achieved by taking a procedure to apply to spray or coat the cleaning agent on the semiconductor substrate surface or any other procedures so far as the semiconductor substrate surface is thoroughly allowed to contact with cleaning agent.

This treatment may be combined with any conventional physical cleaning method such as brush-scrubbing method and megasonic method.

In the present invention, the cleaning agent for the semiconductor substrate surface shows cleaning efficiency at ordinary temperature, and generally the cleaning agent is used at suitable temperature by heating, because the effect for removing contaminants of microfine particles is increased at higher temperature.

In addition to the constitutional ingredients as mentioned above, various auxiliary ingredients such as surfactants, buffers and organic solvents may be contained in the cleaning agent of the present invention within the range which does not inhibit the cleaning efficiency according to the present invention.

The present invention is explained in more detail by referring to the following Examples and Reference Examples, but the present invention is not limited by them.

silicon wafers was washed with ultra-pure water and dried by means of a spin-dryer. The amount of those metallic ions on the surface was measured by the above-mentioned method. The results are shown in Table 1.

Reference Example 1

The silicon wafers contaminated with Fe, Al and Cu prepared in Example 1 were dipped in each one of the solutions nominated as Nos. 11 and 12, having the formations shown in Table 1, and in ultra-pure water (No. 13), then the silicon wafers were treated similarly as in Example 1. The results are also shown in Table 1.

TABLE 1

| | | Formation of the cleaning agent | | | Amount of metallic ions on the surface of wafers (Atoms/cm$^2$) | | |
|---|---|---|---|---|---|---|---|
| No. | Organic acid | Concentration (W/W %) | Complexing agent | Concentration (W/W %) | Fe | Al | Cu |
| 1 | Citric acid | 5 | EDTPO | 0.1 | $1 \times 10^{10}$ | $6 \times 10^{11}$ | $8 \times 10^{10}$ |
| 2 | Oxalic acid | 5 | Hexamethaphosphoric acid | 0.1 | $3 \times 10^{10}$ | $6 \times 10^{12}$ | $7 \times 10^{11}$ |
| 3 | Malonic acid | 5 | Acetylacetone | 0.05 | $8 \times 10^{12}$ | $1 \times 10^{12}$ | $4 \times 10^{12}$ |
| 4 | Tartaric acid | 5 | CyDTA | 0.1 | $8 \times 10^{11}$ | $6 \times 10^{10}$ | $5 \times 10^{11}$ |
| 5 | Citric acid | 5 | EDTA.2NH$_4$ | 1 | $6 \times 10^{10}$ | $8 \times 10^{11}$ | $8 \times 10^{10}$ |
| 6 | Citric acid | 0.5 | Ammonium fluoride | 1 | $4 \times 10^{11}$ | $1 \times 10^{10}$ | $3 \times 10^{11}$ |
| 7 | Citric acid | 10 | Ammonium fluoride | 0.1 | $6 \times 10^{12}$ | $3 \times 10^{10}$ | $5 \times 10^{12}$ |
| 8 | Citric acid | 50 | Ammonium fluoride | 0.1 | $2 \times 10^{12}$ | $2 \times 10^{10}$ | $1 \times 10^{12}$ |
| 9 | Oxalic acid | 5 | HEDPO | 0.1 | $1 \times 10^{10}$ | $4 \times 10^{11}$ | $1 \times 10^{11}$ |
| 10 | Fumaric acid | 1 | Sodium cyanide | 0.1 | $4 \times 10^{11}$ | $7 \times 10^{12}$ | $1 \times 10^{12}$ |
| 11 | — | — | EDTA | 0.1 | $3 \times 10^{13}$ | $5 \times 10^{13}$ | $2 \times 10^{13}$ |
| 12 | Malic acid | 10 | — | — | $9 \times 10^{12}$ | $1 \times 10^{13}$ | $8 \times 10^{12}$ |
| 13 | — | — | — | — | $5 \times 10^{13}$ | $8 \times 10^{13}$ | $2 \times 10^{13}$ |

In the present invention, the amount of metallic impurities on the surface of silicon wafers was measured by "diluted hydrofluoric acid/graphite furnace atomic absorption spectrometry".

In case of preparing reagents and carrying out of analytical operations, ultra-pure water was used, and also hydrofluoric acid of ultra-pure reagent grade was used for the analysis.

EXAMPLE 1

P-type (100) silicon wafers having 6 inches in diameter were dipped in an aqueous solution prepared by adding 100 ppb each of Fe, Al and Cu (each of which is a nitrate solution), then the silicon wafers contaminated with those metallic ions were dried by means of a spin-dryer.

Fe $5 \times 10^{13}$ atoms/cm$^2$, Al $8 \times 10^{13}$ atoms/cm2 and Cu $2 \times 10^{13}$ atoms/cm$^2$ were adsorbed or adhered on the surface of silicon wafers.

Each one of the above-mentioned silicon wafers was dipped in each one of the cleaning agent of the present invention nominated as Nos. 1 to 10, having the formations as shown in Table 1. Then the wafers were treated at 70° C. for 10 minutes. After that, the each one of thus obtained As can be seen from the data shown in Table 1, the amount of the metallic ions on the surface of silicon wafers can be reduced remarkably by treating with the cleaning agent of the present invention.

EXAMPLE 2

Each one of the silicon wafers contaminated with Fe, Al and Cu was prepared by the procedures similar to those employed in Example 1. In case of carrying out a brush-scrubbing cleaning method, each one of silicon wafers was treated by use of a rotation brush made of polyvinyl alcohol, and the cleaning agent of the present invention nominated as Nos. 14 to 23, having the formations as shown in Table 2. Each one of the silicon wafers was treated at 25° C., for 1 minute. After the treatment, the silicon wafers was washed with ultra-pure water and dried by use of a spin-dryer. The amount of metallic ions on the surface of the wafers was measured by the procedures similar to those employed in Example 1. The results are shown in Table 2.

Reference Example 2

In case of cleaning the silicon wafers being contaminated with Fe, Al and Cu used in Example 1, by use of a rotation type brush made of polyvinyl alcohol, each one of the cleaning agents nominated as Nos. 24 and 25, having the formations shown in Table 2 and ultra-pure water (No. 26) was used. The silicon wafers were treated similarly as in Example 2, and the amount of those metallic ions remaining on the surface of the silicon wafers was measured. The results are also shown in Table 2.

and confirmed whether or not there were any corrosion and disconnection on the surface of the silicon wafers. As the result, there were confirmed that Al and Cu wirings were corroded, and some disconnection was observed.

As clearly understood from the description in the specification, by using the cleaning agent for the semicon-

TABLE 2

| | Formation of the cleaning agent | | | | Amount of metallic ions on the surface of wafers (Atoms/cm$^2$) | | |
|---|---|---|---|---|---|---|---|
| No. | Organic acid | Concentration (W/W %) | Complexing agent | Concentration (W/W %) | Fe | Al | Cu |
| 14 | Oxalic acid | 5 | NTPO | 0.5 | $2 \times 10^{11}$ | $1 \times 10^{10}$ | $2 \times 10^{11}$ |
| 15 | Citric acid | 5 | NTPO | 0.5 | $1 \times 10^{11}$ | $2 \times 10^{10}$ | $4 \times 10^{11}$ |
| 16 | Malonic acid | 5 | NTPO | 0.5 | $4 \times 10^{11}$ | $4 \times 10^{11}$ | $7 \times 10^{11}$ |
| 17 | Succinic acid | 5 | NTPO | 0.5 | $5 \times 10^{11}$ | $5 \times 10^{11}$ | $7 \times 10^{11}$ |
| 18 | Acetic acid | 5 | NTPO | 0.5 | $6 \times 10^{11}$ | $9 \times 10^{11}$ | $1 \times 10^{12}$ |
| 19 | Glutaric acid | 1 | Potassium thiocyanate | 5 | $2 \times 10^{11}$ | $5 \times 10^{11}$ | $4 \times 10^{10}$ |
| 20 | Citric acid | 20 | EDDPO | 1 | $4 \times 10^{10}$ | $2 \times 10^{11}$ | $1 \times 10^{12}$ |
| 21 | Adipic acid | 1 | Ammonium fluoride | 10 | $8 \times 10^{11}$ | $3 \times 10^{10}$ | $2 \times 10^{11}$ |
| 22 | Citric acid Oxalic acid | 10 1 | EDTA | 0.1 | $2 \times 10^{11}$ | $5 \times 10^{11}$ | $2 \times 10^{11}$ |
| 23 | Oxalic acid | 1 | Ammonium fluoride Hexamethaphosphoric acid | 0.1 0.1 | $8 \times 10^{10}$ | $4 \times 10^{10}$ | $8 \times 10^{10}$ |
| 24 | Succinic acid | 1 | — | — | $6 \times 10^{12}$ | $7 \times 10^{12}$ | $5 \times 10^{12}$ |
| 25 | — | — | Ethylenediamine | 1 | $1 \times 10^{12}$ | $5 \times 10^{12}$ | $7 \times 10^{12}$ |
| 26 | — | — | — | — | $6 \times 10^{12}$ | $8 \times 10^{12}$ | $9 \times 10^{12}$ |

As can be seen from the data shown in Table 2, in case of conducting physical cleaning in combination with use of the cleaning agent of the present invention, it is understood that the amount of metallic contaminants remaining on the surface of silicon wafers were remarkably reduced. Further, as shown from the results performed by the cleaning agents of the present invention nominated as Nos. 14 to 18, the organic acids having 2 or more of carboxyl group, such as oxalic acid, citric acid, malonic acid and succinic acid, show cleaning efficiency higher than that shown by acetic acid which is an organic acid having only one carboxyl group.

EXAMPLE 3

Each one of silicon wafers provided with wirings of Al and Cu on the substrate surface thereof was dipped in the cleaning agent of the present invention, having the formations of Nos. 1 and 2 as shown in Table 1, respectively, relating to Example 1 as mentioned above, at 70° C. for 1 hour. After that, each one of thus obtained silicon wafers was washed with ultra-pure water and dried by use of a spin-dryer. The metallized wirings on the substrate surface was confirmed by a microscopic observation, and further confirmed by a circuit tester whether there is disconnection or not. As the result, it was confirmed that neither corrosion of the metallized wirings nor disconnection was observed on the surface of the silicon wafers which was dipped in the cleaning agent of the present invention.

Reference Example 3

By the procedures similar to those employed in Example 3, each one of the silicon wafers was treated by use of HPM (HCl: H$_2$O$_2$: H$_2$O=1:1:5) and DHF (1% hydrofluoric acid), ductor substrate surface of the present invention and the cleaning method by using said cleaning agent, the metallic contaminants adsorbed and adhered on the semiconductor substrate surface can be removed efficiently without corroding the metallized wirings and without giving adverse effect on the surface planarization as in the case by using a strong acid-type solution or a strong alkali-type solution being applied in the art.

Thus, the present invention will contribute greatly in the art.

What is claimed:

1. A cleaning agent for cleaning a semiconductor substrate surface, which consists essentially of ultra-pure water, 0.05 to 50% by weight of an organic acid having 1 to 3 carboxyl groups and 0.01 to 10% by weight of a complexing agent having chelating ability selected from the group consisting of ethylenediamine tetraacetic acid, trans-1,2-diaminocyclohexane tetraacetic acid, a phosphonic acid derivative, a condensed phosphoric acid, a diketone, an amine selected from the group consisting of ethylenediamine and triethanolamine, an inorganic ion selected from the group consisting of a halide ion, a cyanide ion, a thiocyanate ion, a thiosulfate ion and an ammonium ion, and a surfactant, to remove metallic contaminants from a semiconductor substrate surface.

2. The cleaning agent as claimed in claim 1, wherein the cleaning agent is an aqueous solution.

3. The cleaning agent as claimed in claim 1, wherein the organic acid is one having 2 to 3 carboxyl groups.

4. The cleaning agent as claimed in claim 1, wherein the organic acid is one selected from the group consisting of a monocarboxylic acid, a dicarboxylic acid, a tricarboxylic acid, an oxycarboxylic acid and an aminocarboxylic acid.

5. The cleaning agent as claimed in claim 1, wherein the organic acid is a dicarboxylic acid or an oxycarboxylic acid.

6. The cleaning agent as claimed in claim 5, wherein the oxycarboxylic acid is an oxydicarboxylic acid or an oxytricarboxylic acid.

7. The cleaning agent as claimed in claim 5, wherein the dicarboxylic acid is one selected from the group consisting of oxalic acid, malonic acid, succinic acid, glutaric acid, adipic acid, pimeric acid, maleic acid, fumaric acid and phthalic acid.

8. The cleaning agent as claimed in claim 5, wherein the oxycarboxylic acid is one, selected from the group consisting of malic acid, tartaric acid and citric acid.

9. The cleaning agent as claimed in claim 1, wherein the complexing agent is one having chelating ability to form complex compounds with metallic contaminants on the semiconductor substrate surface.

10. The cleaning agent as claimed in claim 1, wherein the complexing agent is a phosphonic acid derivative.

11. The cleaning agent as claimed in claim 10, wherein the phosphonic acid derivative is one selected from the group consisting of ethylenediamine tetra(methylenephosphonic acid), ethylenediamine di(methylenephosphonic acid), nitrilotris(methylenephosphonic acid) and 1-hydroxyethylidene-1,1'-diphosphonic acid.

12. The cleaning agent as claimed in claim 1, wherein the organic acid is a dicarboxylic acid or an oxycarboxylic acid and the complexing agent is a phosphonic acid derivative.

13. A cleaning agent for a semiconductor substrate surface, which consists essentially of ultra-pure water, an organic acid having at least one carboxyl group and a complexing agent having chelating ability selected from the group consisting of ethylenediamine tetraacetic acid, trans-1,2-diaminocyclohexane tetraacetic acid, a phosphonic acid derivative, a condensed phosphoric acid, a diketone, an amine selected from the group consisting of ethylenediamine and triethanolamine, an inorganic ion selected from thegroup consisting of a halide ion, a cyanide ion, a thiocyanate ion, a thiosulfate ion and an ammonium ion, wherein the chelating agent is different than the organic acid, and a surfactant, in amounts effective to remove metallic contaminants from a semiconductor substrate surface.

14. A cleaning agent as claimed in claim 1 wherein the concentration of the organic acid is 1 to 30% by weight and the concentration of the complexing agent is 0.1 to 10% by weight.

15. A cleaning agent as claimed in claim 1, wherein a buffer and/or an organic solvent is additionally incorporated in the cleaning agent.

16. A cleaning agent as claimed in claim 13, wherein a buffer and/or an organic solvent is additionally incorporated in the cleaning agent.

17. A cleaning agent as claimed in claim 13, wherein the cleaning agent is an aqueous solution.

* * * * *